(12) United States Patent
Jacques

(10) Patent No.: US 6,483,023 B1
(45) Date of Patent: Nov. 19, 2002

(54) FABRIC WRAPPED OVER SPRING EMI GASKET

(75) Inventor: Joseph F. Jacques, Garland, TX (US)

(73) Assignee: Fujitsu Network Communications, Inc., Richardson, TX (US)

( * ) Notice: Subject to any disclaimer, the term of this patent is extended or adjusted under 35 U.S.C. 154(b) by 0 days.

(21) Appl. No.: 09/496,382

(22) Filed: Feb. 2, 2000

Related U.S. Application Data

(60) Provisional application No. 60/174,368, filed on Jan. 4, 2000.

(51) Int. Cl.⁷ .................................................. H05K 9/00
(52) U.S. Cl. ............................. 174/35 GC; 174/35 R; 361/799; 361/800; 361/816; 361/818
(58) Field of Search ........................ 174/35 GC, 35 R, 174/35 MS; 361/679, 683, 728, 729, 730, 799, 800, 816, 818

(56) References Cited

U.S. PATENT DOCUMENTS

| | | | |
|---|---|---|---|
| 4,631,641 A | | 12/1986 | Brombal et al. |
| 5,028,739 A | * | 7/1991 | Keyser et al. ......... 174/35 GC |
| 5,511,798 A | | 4/1996 | Kawamoto et al. |
| 5,656,795 A | * | 8/1997 | Miska ................. 174/35 GC |
| 5,712,449 A | * | 1/1998 | Miska et al. .......... 174/35 GC |
| 5,959,244 A | | 9/1999 | Mayer |
| 6,096,413 A | * | 8/2000 | Kalinoski et al. ........... 428/220 |
| 6,121,545 A | * | 9/2000 | Peng et al. ............ 174/35 GC |

OTHER PUBLICATIONS

"EMI Shielding for Commercial Electronics," chomerics' catalog, 1999.

Chomerics EMI Shielding Web Site. URL as of May 10, 2000: www.chomerics.com.

* cited by examiner

Primary Examiner—Dean A. Reichard
Assistant Examiner—Carmelo Oliva
(74) Attorney, Agent, or Firm—Baker Botts L.L.P.

(57) ABSTRACT

Metal spring gaskets for EMI shielding in linecard plug-in units are improved by coverings of conductive fabric adhered to the springs with conductive adhesive.

21 Claims, 3 Drawing Sheets

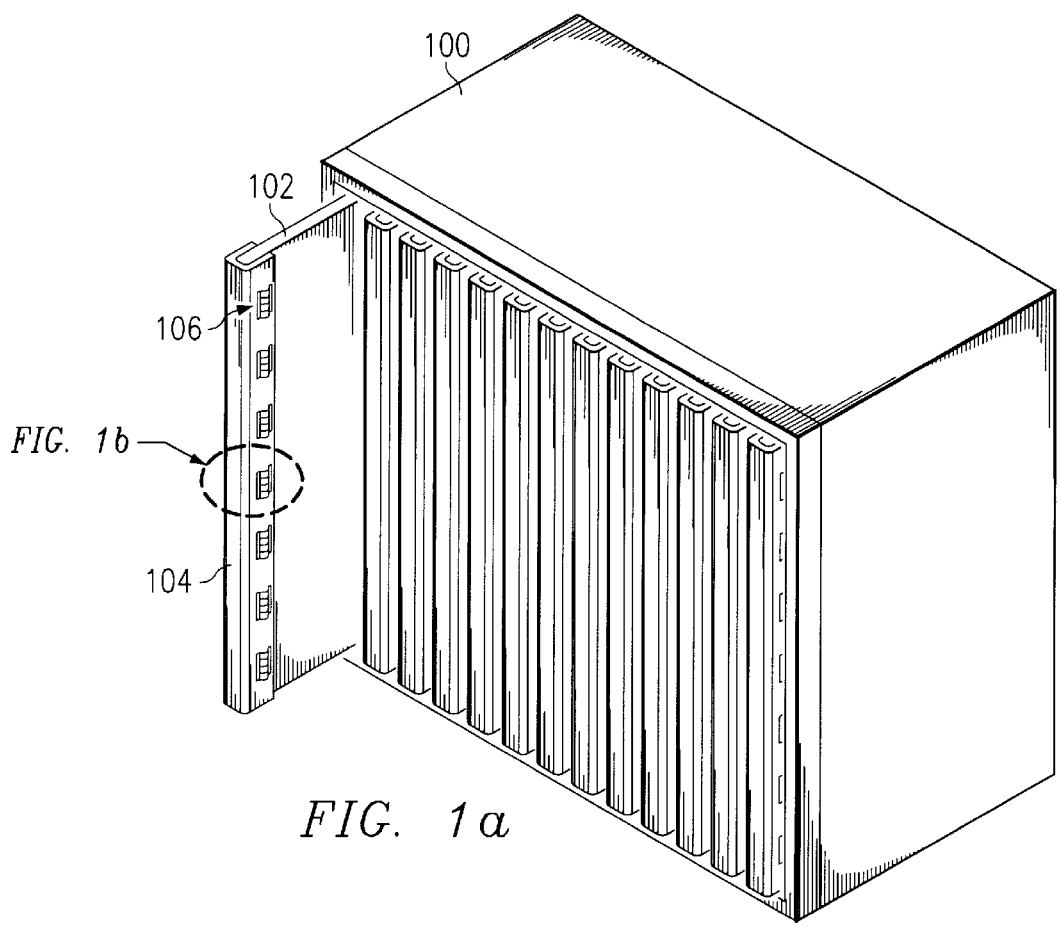
FIG. 1a
FIG. 1b
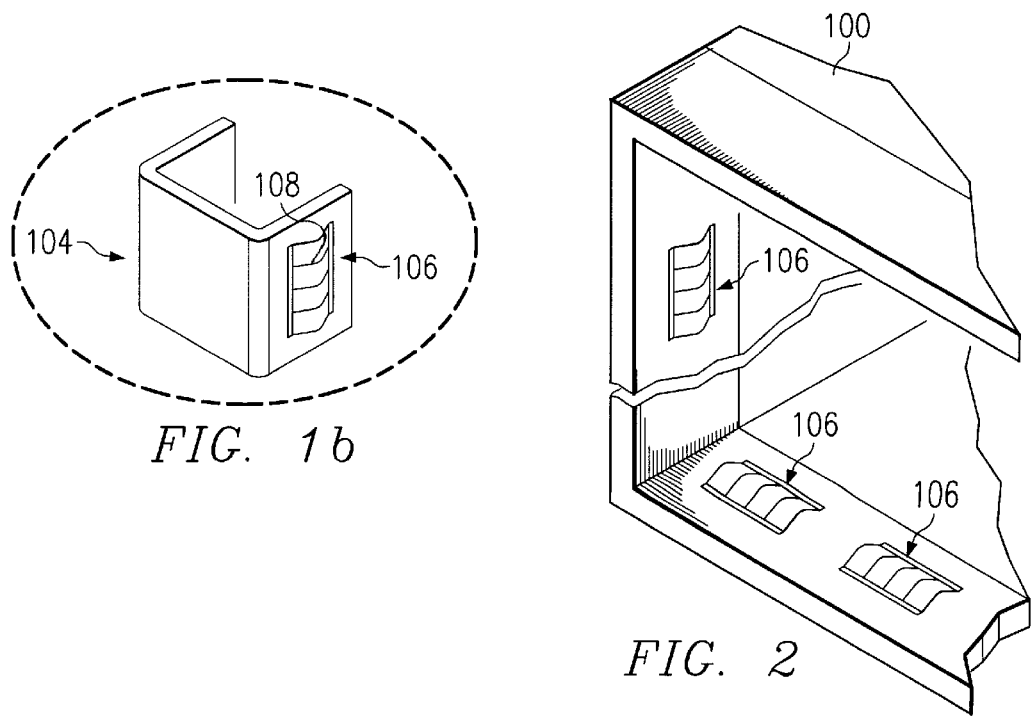
FIG. 1b
FIG. 2

FABRIC WRAPPED OVER SPRING EMI GASKET

This application claims the benefit of provisional application No. 60/174,368 filed Jan. 4, 2000.

BACKGROUND AND SUMMARY OF THE INVENTION

The present invention relates to electronic components, and particularly relates to items of manufacture for shielding electronic components from electromagnetic interference.

Background: EMI Shielding in PIUs

Electronic devices are susceptible to EMI, or Electromagnetic Interference. EMI is radiated or conducted energy that originates from electromagnetic sources, usually other electronic devices. EMI interferes with the normal operation of many electronic devices. One method of reducing the effects of EMI is to shield electronic components from the electromagnetic fields.

EMI shielding is usually achieved by creating a grounded closed shield of conductive material around the components to be protected. This effectively creates a region wherein electromagnetic fields, and hence EMI, are intercepted. Electric fields from inside do not radiate outward beyond the shielding, and exterior electric fields do not enter the protected area.

EMI shielding is applied in many areas. Particularly, plug-in units (PIUs) used in telephone switching require EMI shielding. PIUs are assemblies of printed circuit boards, electronic components, connectors, and a faceplate with latches. The PIUs combine with a backplate circuit board within the shelf to form an electronic system.

Background: Gaskets

PIUs are inserted into slots designed to fit the unit. Card holders are carriages (usually metal) that hold the PIUs in place. Gaskets are used to form a peripheral seal along the edges of a faceplate attached to the end of a PIU, which provides safety grounding of metal parts to the chassis. Latches on the faceplate secure the PIU within the shelf. The gaskets must be flexible enough to be insertable and still hold the carriage in place after insertion.

Another important function of a gasket is to provide a continuous metal connection so that electrical components within the PIU are shielded from EMI. Gaps in the connection between the PIU and the slot can be created when the gasket is damaged, or when the gasket no longer fits properly (such as when a spring experiences compression set or is damaged in other ways). These gaps, or discontinuities in the current flow in the shield, allow exterior fields to interfere with internal components and allow leakage of electromagnetic energy from the internal components to the environment.

Metal finger style EMI gaskets are fragile and easily damaged when not handled properly. This damage can create metal fragments from the spring fingers which might be introduced to sensitive areas, such as where circuitry is housed, causing shorts and other electrical and mechanical problems. Damaged gaskets can also cause snags, poor fit, or possibly injury to handlers.

Prior art attempts to remedy these problems have centered on replacing metal finger-type gaskets with soft-type gaskets. These solutions have their own problems, such as short material life, difficulty in mounting the gaskets, poorer EMI shielding than metal gaskets, flammability, and compression set. It is therefore desirable to have a metal gasket (offering superior shielding and grounding effects) which does not have the disadvantages of fragility, fragment loss, and compression set.

Conductive Fabric Wrapped Over Spring EMI Gasket

The present application discloses that spring gaskets can be improved by covering the springs with a pliable, conductive material, such as a metallized fabric. The covering adheres to a metal or plastic spring by an adhesive or by other means (such as thermal welding, for example).

Embodiments of the present teachings include metal or plastic springs covered in a woven polymer fabric that has been metallized on one or both sides. The adhesive used to fix the fabric to the spring are doped with conducting materials to make the adhesive itself a better conductor.

The disclosed innovations, in various embodiments, provide one or more of at least the following advantages:

fragile metal or plastic springs are protected from damage that can occur during use;

if the springs do fracture, the pieces are retained by the covering and adhesive, which prevents fragments from being introduced into electrical equipment or causing other problems;

the present innovations allow the use of a metal spring core (rather than foam, plastic, elastomer, or other material), which has better EMI shielding and grounding properties, and which experiences less degradation such as particle loss and compression set;

fabric covering decreases spring snagging, prolonging spring life;

fabric coverings may be added to existing springs, and altered springs are easily retrofitted to existing gaskets and holders, as well as existing designs.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1a shows a shelf with linecards within;

FIG. 1b shows a detail of a spring on a gasket;

FIG. 2 shows a shelf with springs inside to contact the PIU;

DETAILED DESCRIPTION OF THE PREFERRED EMBODIMENTS

Figure 3A:
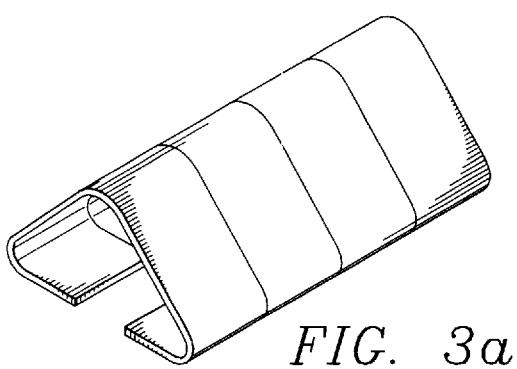
FIGS. 3a and 3b show a spring and a covering of conductive fabric, respectively.

The numerous innovative teachings of the present application will be described with particular reference to the presently preferred embodiment (by way of example, and not of limitation).

FIG. 1a shows a shelf 100 with PIUs 102 inserted. One linecard 102 is shown partially removed to expose the gasket 104. FIG. 1b shows part of a gasket with a metal finger-type spring without covering. In the depicted embodiment, the spring 106 is made up of several fingers 108 that may compress separately from the other fingers 108, but which are part of a unitary whole. FIG. 2 shows a shelf 100 with springs 106 placed inside designed to contact the PIU. Springs are located on the top and bottom of the shelf, and on the sides of the shelf.

Figure 3B:
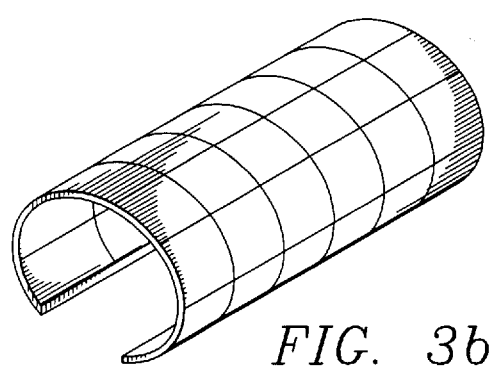
Figure 4A:
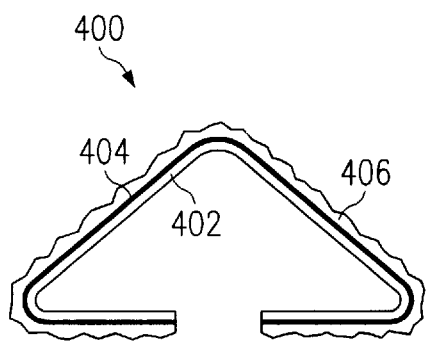
FIG. 4a shows a profile of a spring, adhesive, and conductive fabric covering.

FIGS. 3a and 3b show a spring and a covering of metallized fabric, respectively. FIG. 4a shows how the fabric 406 is adhered to the metal spring 402, with a layer of adhesive 404 between the spring 402 and the fabric 406. In the preferred embodiment, the spring is a metal band having separately compressible fingers, as shown in FIG. 3a. The fabric is a woven polymer fabric that has been metallized on one or both sides. The fabric is adhered to the spring using a conductive adhesive.

Figure 4B:
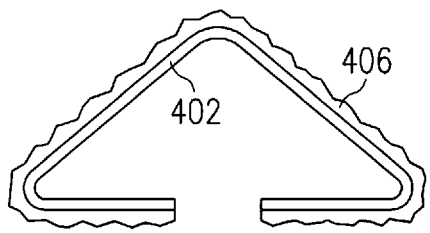
FIG. 4b shows a profile of a spring and covering without an adhesive layer.

Note that other means of fixing the fabric to the spring are also within the contemplation of the present innovations. The adhesive need not be conductive, though a conducting adhesive improves the shielding and grounding properties of the gasket. (Conductive adhesives, commonly known to those of ordinary skill in the art, include adhesives doped with a conducting material, such as silver.) Alternatively, thermal welding can be used to fix the fabric to the spring, omitting the layer of conductive adhesive as shown in FIG. 4b.

Typical tests for gaskets require 300 or more insertions to be withstood without substantial degradation. Tests on the preferred embodiment showed no substantial damage to the metallized fabric covering used. Tests of damaged springs showed fragment retention by the adhesive and fabric covering. Insertion force of the PIUs equipped with the covered metal springs did not substantially increase, indicating that the coverings did not increase friction by a noticeable amount.

Fabric Covered Polymer Springs

The present innovations can be implemented with a number of spring designs. For instance, plastic springs could be outfitted with a metallized cloth covering. For a plastic core spring, sufficiently rigid high strength polymers would likely be susceptible to the same breakage and fragmentation that metal springs experience. Such breakage, and the resulting fragmentation, would be solved by the adhesive covering (meaning fragments would adhere to the covering rather than be introduced into interior components). Though the present innovations are applicable to plastic springs, metal springs have better conducting, shielding, and grounding properties, and are the preferred embodiment.

Spring Shapes

Figure 5A:
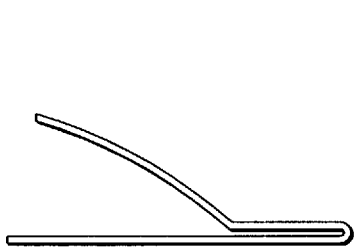
FIGS. 5a, 5b, and 5c and 5d show a profile of another type of spring, another view of the same spring, a conductive fabric covering for the spring, and the spring covered with the fabric, respectively.
Figure 5B:
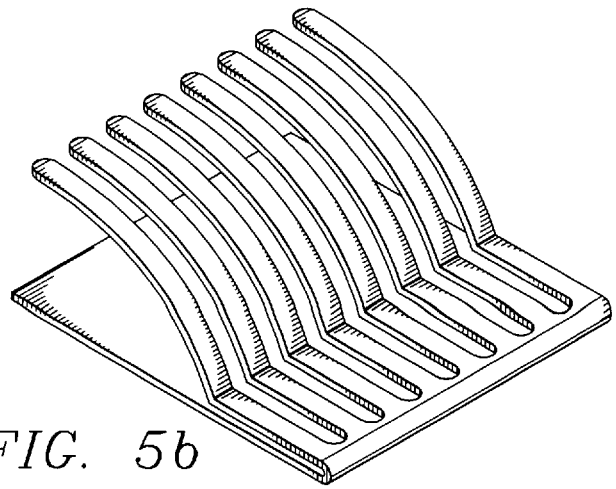
Figure 5C:
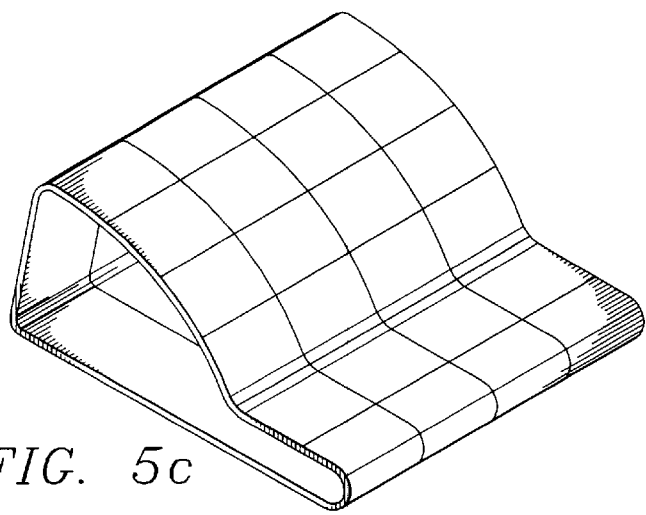
Figure 5D:
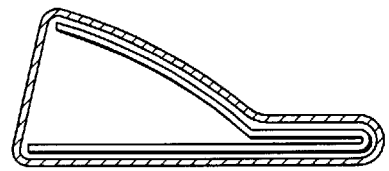

The present application also teaches that coverings can be used with a variety of metal spring shapes. FIG. 5a shows a profile of a spring with fingers that are not anchored on one end. FIG. 5b shows the same type of spring from a different angle, and FIG. 5c shows a metallized fabric covering for the same spring. FIG. 5d shows the spring inside the covering.

Figure 6A:
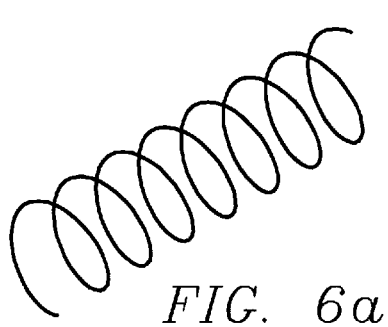
FIGS. 6a and 6b show a coiled spring and a conductive fabric covering, respectively.
Figure 6B:
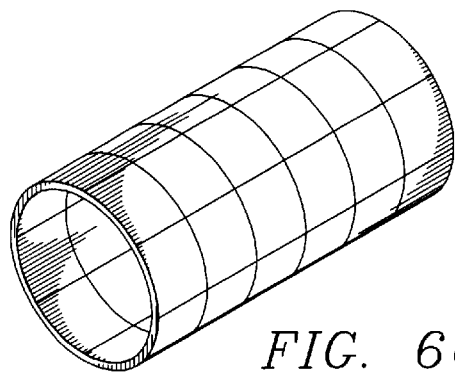

FIG. 6a shows a coil-type spring. The depicted spring is circular, but canted coils are also commonly in use. Such differences would not affect the application of the present innovations to the gasket. FIG. 6b shows a fabric covering for the same spring.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

Spring: a mechanical device that returns to its original shape after being compressed; the force exerted by a spring depends on the deflection distance and not on hysteresis.

Compression set: deflection that remains in a material after the load is removed.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Figure 7A:
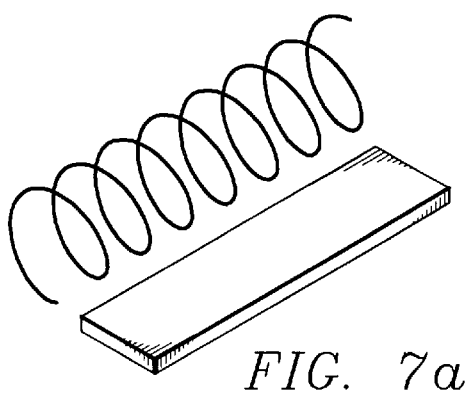
FIGS. 7a and 7b show another type of spring (with a support rod) and a conductive fabric covering, respectively.
Figure 7B:
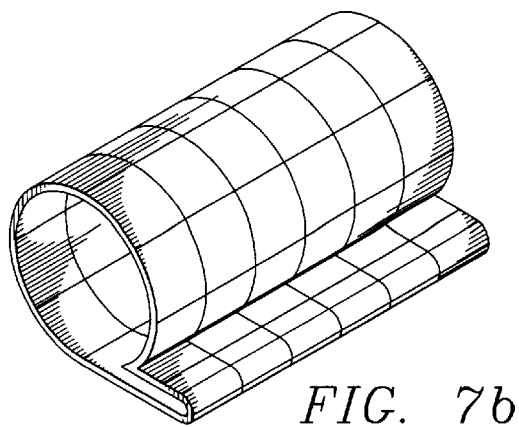

The present innovations could be used to make other gaskets, including cantilevered spring coils. The coil for the spring is covered with a conductive sleeve or wrap that contains the spring coil, both protecting it and offering greater conducting surface area for EMI shielding. Likewise, other elements may be encased in the sleeve, such as a stiffening rod used to support a spring. The sleeve can be fashioned to encase the coil and the stiffener, as shown in FIGS. 7a and 7b.

Other applications of the present innovations include using a mesh core covered with a conductive fabric.

In another embodiment, the covering for the spring is a polymer film (either doped to be conductive or coated with a conductive material) instead of a woven fabric.

Another embodiment comprises a fabric covered spring wherein the fabric is shrink-fitted over the spring, requiring minimal adhesive or none at all.

Any gaskets for linecard PIUs, shelves, shelf covers, cabinet doors, or any other location where EMI shielding is desired can implement the present innovations.

Additional general background, which helps to show the knowledge of those skilled in the art regarding variations and implementations, may be found in the following publications, all of which are hereby incorporated by reference: EMI SHIELDING FOR COMMERCIAL ELECTRONICS by Chomerics.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A conductive edge contact, comprising:
   a spring for a plug-in unit comprising a printed circuit board and a connector, wherein the spring is mounted to a structural support of the plug-in unit and wherein the spring comprises fingers; and
   a flexible conductive covering adhered to the spring and extending between the fingers, whereby if one of the fingers breaks then fragments thereof will be held by the conductive covering.

2. The contact of claim 1, wherein the spring comprises metal.

3. The contact of claim 1, wherein the spring comprises plastic.

4. The contact of claim 1, wherein the conductive covering comprises a woven polymer which has been metallized on at least one surface.

5. The contact of claim 1, wherein the conductive covering is adhered to the spring by a conductive adhesive.

6. The contact of claim 1, wherein the conductive covering is adhered to the spring by thermal welding.

7. A conductive gasket for a linecard, comprising:

one or more springs positioned on the linecard, wherein each spring comprises fingers; and a conductive fabric for each spring, said fabric at least partially covering and extending between the fingers, whereby if one of the fingers breaks then fragments thereof will be held by the fabric.

8. The gasket of claim 7, wherein the springs comprise metal.

9. The gasket of claim 7, wherein the springs comprise plastic.

10. The gasket of claim 7, wherein the conductive fabric is adhered to the springs by a conductive adhesive.

11. The gasket of claim 7, wherein the conductive fabric comprises a woven polymer which has been metallized on at least one surface.

12. An electronic system, comprising:

a system housing having a surface with at least one aperture therein;

at least one removable component, having an exterior which fills at least part of said aperture;

wherein said exterior is electrically connected to said surface by a contact which includes a spring mounted to a structural support, wherein the spring comprises fingers; and a flexible conductive fabric at least partially covering and extending between the fingers, whereby if one of the fingers breaks then fragments thereof will be held by the fabric; and wherein the aperture is substantially shielded against EMI.

13. The system of claim 12, wherein the spring comprises metal.

14. The system of claim 12, wherein the spring comprises plastic.

15. The system of claim 12, wherein the conductive fabric comprises a woven polymer which has been metallized on at least one surface.

16. The system of claim 12, wherein the conductive fabric is adhered to the spring by a conductive adhesive.

17. The system of claim 12, wherein the conductive fabric is adhered to the spring by shrink-fitting.

18. A conductive contact, comprising:

a metallic spring for a plug-in unit comprising a printed circuit board and a connector, wherein the spring is mounted to a structural support of the plug-in unit and wherein the spring comprises fingers; and a flexible conductive fabric comprising a woven polymer which has been metallized on at least one surface, the fabric adhered to the spring and extending between the fingers, whereby if one of the fingers breaks then fragments thereof will be held by the fabric.

19. The contact of claim 18, wherein the conductive fabric is adhered to the spring by a conductive adhesive.

20. The contact of claim 18, wherein the conductive fabric is adhered to the spring by thermal welding.

21. A shelf comprising:

a plurality of plug-in linecards;

at least one of the plug-in linecards comprising a printed circuit board, electronic components, connectors and a faceplate with latches;

the plug-in linecards further comprising a gasket along an edge of the faceplate;

the gasket comprising a plurality of metal finger-type springs; and a metallized fabric covering and extending between each metal finger-type spring wherein a layer of conductive adhesive is between the metal finger-type spring and the metallized fabric.

* * * * *

UNITED STATES PATENT AND TRADEMARK OFFICE
CERTIFICATE OF CORRECTION

PATENT NO.     : 6,483,023 B1
DATED          : November 19, 2002
INVENTOR(S)    : Joseph F. Jacques It is certified that error appears in the above-identified patent and that said Letters Patent is hereby corrected as shown below:

Title Page,
Item [56], References Cited, OTHER PUBLICATIONS, after "Electronics" delete "chomerics" and insert -- Chomerics --.

Signed and Sealed this

Twenty-third Day of September, 2003

JAMES E. ROGAN
*Director of the United States Patent and Trademark Office*